United States Patent

Nakanishi

[11] Patent Number: 6,072,243
[45] Date of Patent: *Jun. 6, 2000

[54] SEMICONDUCTOR INTEGRATED CIRCUIT DEVICE CAPABLE OF SURELY ELECTRICALLY INSULATING TWO SEMICONDUCTOR CHIPS FROM EACH OTHER AND FABRICATING METHOD THEREOF

[75] Inventor: Hiroyuki Nakanishi, Kitakatsuragi-gun, Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/975,461

[22] Filed: Nov. 21, 1997

[30] Foreign Application Priority Data

Nov. 26, 1996 [JP] Japan .................................. 8-314716

[51] Int. Cl.$^7$ .................................................. H01L 23/48
[52] U.S. Cl. .......................... 257/783; 257/676; 257/686; 257/777; 438/107; 438/118
[58] Field of Search .................................. 257/671, 686, 257/676, 700, 777, 783, 782; 438/107, 108, 118, 125

[56] References Cited

U.S. PATENT DOCUMENTS

| | | | |
|---|---|---|---|
| 5,214,307 | 5/1993 | Davis | 257/676 |
| 5,432,380 | 7/1995 | Jin et al. | 257/676 |
| 5,536,970 | 7/1996 | Higashi et al. | 257/676 |
| 5,545,922 | 8/1996 | Golwalkar et al. | 257/676 |

FOREIGN PATENT DOCUMENTS

| | | | |
|---|---|---|---|
| 62-147360 | 9/1987 | Japan . | |
| 1-132149 | 5/1989 | Japan | 257/783 |
| 1-166530 | 6/1989 | Japan | 257/783 |
| 2-344 | 1/1990 | Japan | 257/783 |
| 2-144954 | 6/1990 | Japan | 257/783 |
| 6-97353 | 8/1994 | Japan . | |

*Primary Examiner*—David Hardy
*Assistant Examiner*—George C. Eckert, II
*Attorney, Agent, or Firm*—Nixon & Vanderhye P.C.

[57] ABSTRACT

There is provided a semiconductor integrated circuit device having integrally a flat-plate-shaped die pad 11 formed in a lead frame 10, a first semiconductor chip 7 bonded via a first adhesive layer 1 to one surface 11a of the die pad 11 and a second semiconductor chip 8 bonded via a second adhesive layer 2 to the other surface 11b of the die pad 11. The first adhesive layer 1 is comprised of an insulating film having a specified thickness. The first semiconductor chip 7 and the second semiconductor chip 8 can be surely electrically insulated from each other.

9 Claims, 5 Drawing Sheets

6,072,243

SEMICONDUCTOR INTEGRATED CIRCUIT DEVICE CAPABLE OF SURELY ELECTRICALLY INSULATING TWO SEMICONDUCTOR CHIPS FROM EACH OTHER AND FABRICATING METHOD THEREOF

BACKGROUND OF THE INVENTION

The present invention relates to a semiconductor integrated circuit device in which a plurality of semiconductor chips are integrally encapsulated and a fabricating method thereof.

In recent years, for the achievement of high-density packaging of electronic components, a semiconductor integrated circuit device provided with semiconductor chips 107 and 108 mounted on both surfaces of a die pad 111 formed in a lead frame 110 as shown in FIG. 10 has been proposed (Japanese Utility Model Laid-Open Publication No. SHO 62-147360). This semiconductor integrated circuit device is constructed by bonding (die bonding) the semiconductor chip 107 by means of a silver paste 102 onto one surface 111a of the die pad 111, bonding the semiconductor chip 108 onto the other surface 111b of the die pad 111 by means of a silver paste 103, connecting (wire bonding) electrode pads 107p and 108p formed on the surfaces 107a and 108a of the semiconductor chips 107 and 108 to inner leads 112 and 112 formed in the lead frame 110 by way of respective wires (thin wires such as gold wires) 150 and 150 and thereafter encapsulating (molding) these members in an encapsulating resin 160. It is to be noted that support leads (not shown) formed in the lead frame 110 are cut, and outer leads 113 connected to the inner leads 112 are bent in a shape corresponding to the use. The silver pastes (having epoxy resin blended with silver powder as its main ingredient) 102 and 103 are fluid materials containing a solvent before being hardened, and they are to be hardened by vaporizing the solvent by heating. In a die bonding stage, for example, the silver paste 102 before being hardened is supplied onto the one surface 111a of the die pad 111 and the semiconductor chip 107 is mounted on it, where the silver paste 102 is spread in a planar direction as interposed between the die pad 111 and the semiconductor chip 107. Subsequently, the silver paste 102 is hardened by heating. The reason why the silver paste 102 is spread in the planar direction is for the purpose of preventing the possible occurrence of a cavity which will cause a crack in the encapsulating resin 160 between the silver paste 102 and the semiconductor chip 107.

However, according to the structure shown in FIG. 10, the rear surface 107b of the semiconductor chip 107 is electrically continued to the rear surface 108b of the semiconductor chip 108 via the silver paste 102, the die pad 111 and the silver paste 103. Therefore, the semiconductor chips which can be mounted are limited to those whose rear surfaces (often exposed surfaces of the silicon substrates) 107b and 108b become equi-potential (memory IC chips such as flash memories, mask ROMs and the like fabricated through an identical process). This is because the semiconductor chips do not operate correctly when a semiconductor chip having a P-type silicon substrate and a semiconductor chip having an N-type silicon substrate are mounted or when the electric potentials of silicon substrates are different from each other even if the silicon substrates are of the same type.

In this case, it seems that, if non-conductive silverless pastes (having epoxy resin blended with no silver powder as a main ingredient) 104 and 105 shown in FIG. 11 are used in place of the conductive silver pastes 102 and 103, then the die pad 111 and the rear surfaces 107b and 108b of the semiconductor chips 107 and 108 can be electrically insulated from each other. However, the silverless pastes 104 and 105 are also fluid materials containing a solvent before being hardened similarly to the silver pastes 102 and 103. Therefore, when, for example, the silverless paste 104 is spread in the planar direction as interposed between the die pad 111 and the semiconductor chip 107 in the die bonding stage, the parallelism and distance between the die pad 111 and the semiconductor chip 107 are out of control, possibly leading to a continuity as a consequence of the contact of the semiconductor chip 107 with the die pad 111. The same thing can be said for the semiconductor chip 108. In particular, when an attempt at providing a thin type structure such as TSOP (Thin Small Outline Package) or TQFP (Thin Quad Flat Package) is made, the silverless pastes 104 and 105 cannot help having extremely reduced thicknesses since the semiconductor chips 107 and 108 are stacked in the direction of thickness in the above structure, and this increases the possibility of the contact between the die pad 111 and the semiconductor chips 107 and 108.

SUMMARY OF THE INVENTION

The object of the present invention is therefore to provide a semiconductor integrated circuit device in which semiconductor chips are mounted on both surfaces of a die pad, the device being capable of surely electrically insulating two semiconductor chips from each other in the semiconductor integrated circuit device.

In order to achieve the aforementioned object, the present invention provides a semiconductor integrated circuit device having integrally a flat-plate-shaped die pad formed in a lead frame; a first semiconductor chip bonded via a first adhesive layer to one surface of the die pad and a second semiconductor chip bonded via a second adhesive layer to the other surface of the die pad, wherein at least one of the first adhesive layer and the second adhesive layer is comprised of an insulating film having a specified thickness.

According to the semiconductor integrated circuit device of the present invention, in the case where the first adhesive layer is the insulating film, when the first adhesive layer is interposed between the die pad and the first semiconductor chip in the die bonding stage, the distance between the die pad and the first semiconductor chip is easily secured according to the thickness of the insulating film which serves as this first adhesive layer. It is to be noted that this distance is maintained even when the bonding process of the die pad and the second semiconductor chip follows. Similarly, in the case where the second adhesive layer is the insulating film, when the second adhesive layer is interposed between the die pad and the second semiconductor chip in the die bonding stage, the distance between the die pad and the second semiconductor chip is easily secured according to the thickness of the insulating film which serves as this second adhesive layer. It is to be noted that this distance is maintained even when the bonding process of the die pad and the first semiconductor chip follows. Thus, at least one of the first semiconductor chip and the second semiconductor chip is surely electrically insulated from the die pad via the insulating film. Therefore, the first semiconductor chip and the second semiconductor chip are surely electrically insulated from each other.

As a result, the semiconductor chips can be correctly operated even in the case where a semiconductor chip having a P-type silicon substrate and a semiconductor chip having an N-type silicon substrate are used as the first semiconductor chip and the second semiconductor chip or in the case where the silicon substrates are of the same type and the silicon substrates have mutually different electric potentials in operation. That is, according to this semiconductor integrated circuit device, semiconductor chips having different functions can be integrally encapsulated and correctly operated. Therefore, this arrangement allows the semiconductor integrated circuit devices used in electronic equipment to be reduced in number and allows the electronic equipment to have improved functions without causing an increase in volume of the electronic equipment.

In one embodiment, the insulating film is comprised of a resin material having an imide bond or an amide bond or both the imide bond and amide bond.

According to the above embodiment, by performing heating and pressing with the above insulating film interposed between the die pad and the first semiconductor chip in the die bonding stage, the die pad and the first semiconductor chip can be easily bonded (by thermocompression bonding) to each other. Similarly, by performing heating and pressing with the above insulating film interposed between the die pad and the second semiconductor chip in the die bonding stage, the die pad and the second semiconductor chip can be easily bonded to each other.

In one embodiment, a dimension in a planar direction of the insulating film is greater than a dimension in a planar direction of the semiconductor chip bonded to the insulating film.

According to the above embodiment, when the first adhesive layer is the above insulating film, the die pad and the first semiconductor chip are more surely insulated electrically from each other. Similarly, when the second adhesive layer is the above insulating film, the die pad and the second semiconductor chip are more surely insulated electrically from each other.

In one embodiment, the insulating film and the semiconductor chip adjacent to the insulating film are bonded to each other by means of an adhesive which is hardened at a temperature at which the insulating film maintains its solid state.

It is to be noted that the "solid state" means a state having a characteristic such that it has a specific volume and shape and a resistance is exerted against a force for changing it throughout this specification.

When fabricating the semiconductor integrated circuit device of the present embodiment, a lead frame in which the insulating film has been bonded to the die pad by thermocompression bonding or the like is prepared before the die bonding process. Subsequently, an adhesive before being hardened is supplied onto the insulating film, and a (first or second) semiconductor chip is placed on it. Then, after the adhesive is spread in the planar direction as interposed between the insulating film and the semiconductor chip, the adhesive is hardened by heating. In this stage, the distance between the die pad and the semiconductor chip is secured by virtue of the existence of the insulating film maintaining the solid state, by which the electrical insulation between the die pad and the semiconductor chip is secured. Therefore, the first semiconductor chip and the second semiconductor chip are surely electrically insulated from each other.

In this semiconductor integrated circuit device, by preparing a lead frame in which the insulating film has been bonded to the die pad by thermocompression bonding or the like, each semiconductor chip can be bonded to the die pad by the equipment for the prior art semiconductor integrated circuit device in the stage of practically performing the die bonding of each semiconductor chip.

In one embodiment, the adhesive is an insulating material.

According to the semiconductor integrated circuit device of the present embodiment, even if the adhesive oozes from between the insulating film and the semiconductor chip and flows onto the die pad surface when the adhesive is spread in the planar direction as interposed between the insulating film and the semiconductor chip in the die bonding stage, the electrical insulation between the die pad and the semiconductor chip is maintained because the adhesive is an insulating material.

In one embodiment, the insulating film is provided with at least one hole penetrating its film surface.

According to this embodiment, the portion (area) which belongs to the insulating film and comes in contact with the die pad is reduced by virtue of the existence of the hole, and therefore, the warp of the die pad due to a difference in thermal expansion coefficient between the die pad and the insulating film is reduced.

In one embodiment, the insulating film is arranged as divided into a plurality of portions along a die pad surface.

According to this embodiment, the insulating film is arranged as divided into a plurality of portions along the die pad surface, and therefore, the warp of the die pad due to a difference in thermal expansion coefficient between the die pad and the insulating film is reduced.

The present invention provides a semiconductor integrated circuit device having integrally a flat-plate-shaped die pad formed in a lead frame; a first semiconductor chip bonded by means of a first adhesive to one surface of the die pad and a second semiconductor chip bonded by means of a second adhesive to the other surface of the die pad, wherein a plurality of semispherical spacers made of a material which maintains its solid state through a bonding process of the die pad and the semiconductor chips by the adhesives are provided on the one surface or the other surface or both the surfaces of the die pad such that they are separated apart from one another.

When fabricating the semiconductor integrated circuit device, a lead frame in which the plurality of semispherical spacers separated apart from one another on one surface or the other surface or both surfaces of the die pad are preparatorily provided before the die bonding process is prepared. In the case where the plurality of semispherical spacers are provided on one surface of the die pad, the first adhesive before being hardened is supplied onto the one surface provided with the spacers, and the first semiconductor chip is placed on it. Then, after the first adhesive is spread in the planar direction as interposed between the one surface and the first semiconductor chip, the first adhesive is hardened by heating. In this stage, the distance between the die pad and the first semiconductor chip is secured by virtue of the existence of the plurality of semispherical spacers which maintain the solid state. It is to be noted that this distance is maintained even when the bonding process of the die pad and the second semiconductor chip follows. Similarly, in the case where the plurality of semispherical spacers are provided on the other surface of the die pad, the second adhesive before being hardened is supplied onto the other surface provided with the spacers, and the second semiconductor chip is placed on it. Then, after the second adhesive is spread in the planar direction as interposed between the other surface and the second semiconductor chip, the second adhesive is hardened by heating. In this stage, the distance between the die pad and the second semiconductor chip is secured by virtue of the existence of the plurality of semispherical spacers which maintain the solid state. It is to be noted that this distance is maintained even when the bonding process of the die pad and the first semiconductor chip follows. Thus, at least one of the first semiconductor chip and the second semiconductor chip is surely electrically insulated from the die pad via the semispherical spacers. Therefore, the first semiconductor chip and the second semiconductor chip are surely electrically insulated from each other.

Furthermore, as described above, by preparing the lead frame in which the die pad is provided with the plurality of semispherical spacers, each semiconductor chip can be bonded to the die pad by the equipment for the prior art semiconductor integrated circuit device in the stage of practically performing the die bonding of each semiconductor chip.

Furthermore, the plurality of semispherical spacers are provided as separated apart from one another, and therefore, neither the warp of the die pad nor the like occurs differently from the case where the insulating film is bonded to the die pad.

The present invention provides a semiconductor integrated circuit device fabricating method for mounting a first semiconductor chip and a second semiconductor chip respectively onto one surface and the other surface of a flat-plate-shaped die pad formed in a lead frame, comprising:

bonding an insulating film made of a material which maintains its solid state through a bonding process of the die pad and the semiconductor chips onto one surface of the die pad;

supplying a first adhesive before being hardened onto the insulating film;

placing the first semiconductor chip on the first adhesive and spreading the first adhesive in a planar direction while interposing the first adhesive between the insulating film and the first semiconductor chip;

hardening the first adhesive by heating;

supplying a second adhesive before being hardened onto the other surface of the die pad;

placing the second semiconductor chip on the second adhesive and spreading the second adhesive in a planar direction while interposing the second adhesive between the other surface and the second semiconductor chip; and hardening the second adhesive by heating.

According to the semiconductor integrated circuit device fabricating method, in the process for spreading the first adhesive in the planar direction while interposing the adhesive between the insulating film and the first semiconductor chip, the distance between the die pad and the first semiconductor chip is secured by virtue of the existence of the insulating film which maintains the solid state. It is to be noted that this distance is maintained even in the bonding process of the die pad and the second semiconductor chip. Thus, the first semiconductor chip is surely electrically insulated from the die pad via the insulating film. Therefore, the first semiconductor chip and the second semiconductor chip are surely electrically insulated from each other.

Furthermore, by preparatorily completing the process for bonding the insulating film to the one surface of the die pad, each semiconductor chip can be bonded to the die pad by the equipment for the prior art semiconductor integrated circuit device in the stage of practically performing the die bonding of each semiconductor chip.

The present invention provides a semiconductor integrated circuit device fabricating method for mounting a first semiconductor chip and a second semiconductor chip respectively onto one surface and the other surface of a flat-plate-shaped die pad formed in a lead frame, comprising:

providing a plurality of semispherical spacers made of a material which maintains its solid state through a bonding process of the die pad and each semiconductor chip on one surface of the die pad while separating them apart from one another;

supplying a first adhesive before being hardened onto one surface on which the spacers are provided;

placing the first semiconductor chip on the first adhesive and spreading the first adhesive in a planar direction while interposing the first adhesive between the one surface and the first semiconductor chip;

hardening the first adhesive by heating;

supplying a second adhesive before being hardened a onto the other surface of the die pad;

placing the second semiconductor chip on the second adhesive and spreading the second adhesive in a planar direction while interposing the second adhesive between the other surface and the second semiconductor chip; and hardening the second adhesive by heating.

According to the semiconductor integrated circuit device fabricating method, in a process for spreading the first adhesive in the planar direction while interposing the first adhesive between the one surface and the first semiconductor chip, the distance between the die pad and the first semiconductor chip is secured by virtue of the existence of the plurality of semispherical spacers which maintain the solid state. It is to be noted that this distance is maintained even in the bonding process of the die pad and the second semiconductor chip. Thus, the first semiconductor chip is surely electrically insulated from the die pad via the semispherical spacers. Therefore, the first semiconductor chip and the second semiconductor chip are surely electrically insulated from each other.

Furthermore, by preparatorily completing a process for providing the plurality of semispherical spacers on the one surface of the die pad, each semiconductor chip can be bonded to the die pad by the equipment for the prior art semiconductor integrated circuit device in the stage of practically performing the die bonding of each semiconductor chip.

Furthermore, the plurality of semispherical spacers which are separated apart from one another are provided, and therefore, neither the warp of the die pad nor the like occurs differently from the case where the insulating film is bonded to the die pad.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Preferred embodiments of the present invention will be described in detail below.

(First Embodiment)

Figure 1A:
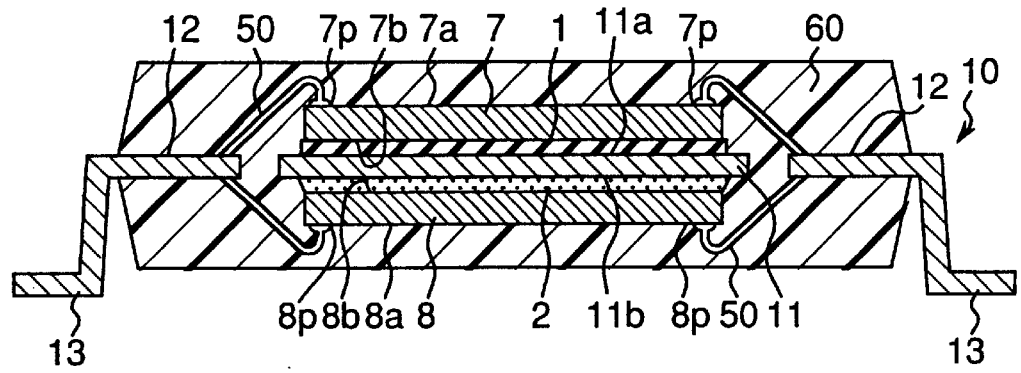
FIG. 1a is a longitudinal sectional view showing a semiconductor integrated circuit device according to a first embodiment of the present invention.
Figure 1B:
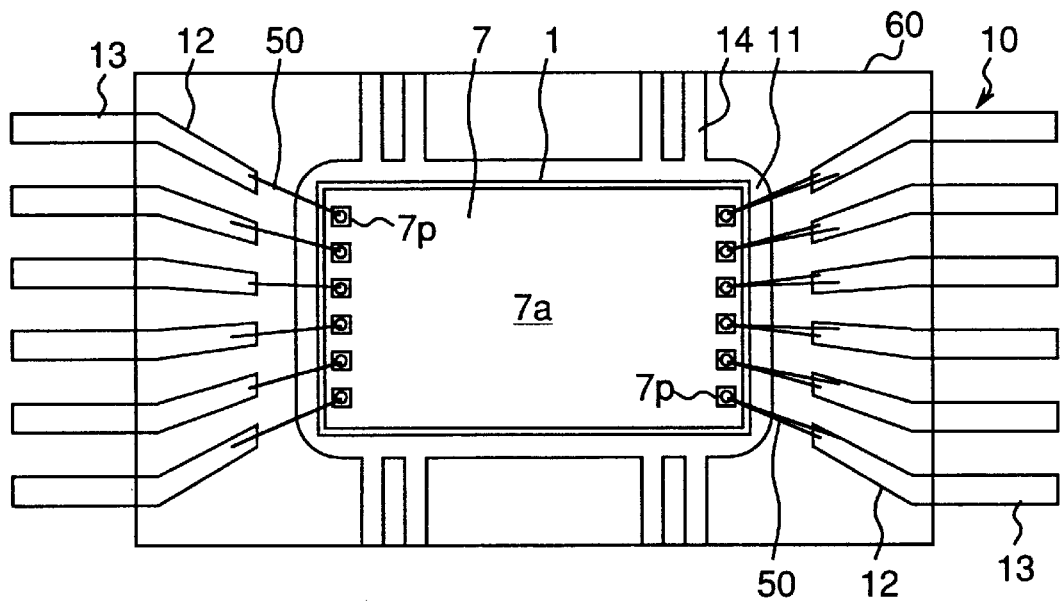
FIG. 1b is a view of the above semiconductor integrated circuit device viewed from above with its encapsulating resin in an upper portion removed.

FIG. 1a shows a longitudinal sectional view of a semiconductor integrated circuit device according to a first embodiment, while FIG. 1b schematically shows the semiconductor integrated circuit device viewed from above with an upper portion of its encapsulating resin 60 removed.

This semiconductor integrated circuit device comprises a lead frame 10 having a flat-plate-shaped die pad 11, inner leads 12 which are arranged on both sides of the die pad 11 and separated apart from each other, outer leads 13 connected to the inner leads 12 and support leads 14 continued to the die pad 11. To one surface 11a of the die pad 11 is bonded a first semiconductor chip 7 by an insulating film 1 which serves as a first adhesive layer, while to the other surface 11b of the die pad 11 is bonded a second semiconductor chip 8 by a silverless paste 2 which serves as a second adhesive layer.

On the surfaces 7a and 8a of semiconductor chips 7 and 8 are formed respective electrode pads 7p and 8p, and the semiconductor chips 7 and 8 are connected to the die pad 11 at their rear surface sides 7b and 8b.

As a material of the insulating film 1, a thermoplastic silicon modified polyimide of which glass-transition temperature falls within a range of 140 to 250° C. being, for example, 141° C. is adopted. This insulating film 1 is a single-layer film which has a rectangular shape and a constant thickness of 30 μm, and the dimensions in the planar direction of the insulating film 1 are set slightly greater than the dimensions in the planar direction of the chips 7 and 8.

The silverless paste (having epoxy resin blended with no silver powder as a main ingredient) 2 is a fluid material which includes a solvent before being hardened and is to be hardened by vaporizing the solvent by heating.

This semiconductor integrated circuit device is fabricated as follows.

(1) An insulating film 1 which has a dimension in the planar direction slightly greater than the semiconductor chip 7 and a dimension in the planar direction smaller than the die pad 11 is prepared by processing a tape-shaped silicon modified polyimide singlelayer film by punching.

(2) The insulating film 1 is placed on one surface 11a of the die pad 11 formed in the lead frame 10, and it is pressed from above by a heated tool (having a pressing surface parallel to the surface 11a of the die pad). By this operation, the insulating film 1 is bonded to the surface 11a of the die pad 11 by thermocompression bonding. The conditions of this thermocompression bonding differ depending on the glass-transition temperature of the tape. The heating temperature is set to a temperature of 300 to 400° C. (300° C. when the glass-transition temperature is 141° C.) higher than the glass-transition temperature of 140 to 250° C. of the insulating film 1, the time for pressing is set to about one second, and the application pressure is set to about 5 to 10 MPa. Then, the semiconductor chip 7 is placed on the insulating film 1, and the surface 7a on which the electrode pad 7p is formed is pressed from above by the heated tool, thereby bonding the semiconductor chip 7 to the insulating film 1 by thermocompression bonding. The same thermocompression bonding conditions as those of the thermocompression bonding of the die pad 11 and the insulating film 1 are adopted. In this case, the distance between the die pad 11 and the semiconductor chip 7 can be easily secured according to the thickness of the insulating film 1. Thus, the semiconductor chip 7 is mounted on the die pad 11 via the insulating film 1 in a state in which they are electrically insulated from each other.

(3) Next, the silverless paste 2 before being hardened is supplied onto the other surface 11b of the die pad 11 with the other surface 11b facing upward. This supply is performed by pressurizing by means of a dispenser the silverless paste 2 stuffed inside, for example, a syringe (not shown) from the tail end of the syringe through a nozzle attached to the tip end of the syringe. The semiconductor chip 8 is placed on it and pressed from above by a collet (not shown) attracting by suction the semiconductor chip 8. By this operation, the silverless paste 2 is interposed between the die pad 11 and the semiconductor chip 8 and spread in the planar direction. It is to be noted that the reason why the silverless paste 2 is spread in the planar direction is for the purpose of preventing the possible occurrence of a cavity which will cause a crack in the encapsulating resin 60 between the silverless paste 2 and the semiconductor chip 8. Subsequently, heating is performed in an oven (not shown) at a temperature of about 180° C. for one hour, thereby hardening the silverless paste 2. Thus, the semiconductor chip 8 is mounted on the die pad 11 via the silverless paste 2.

(4) Next, the electrode pads 7p and 8p formed on the surfaces 7a and 8a of the semiconductor chips 7 and 8 are connected (wire-bonded) to the inner leads 12 and 12 formed in the lead frame 10 by means of wires (thin wires such as gold wires) 50 and 50. In this case, the electrode pads 7p and 8p which are to take an identical signal are connected to an identical inner lead 12, and the electrode pads 7p and 8p which are to take different signals are connected to different inner leads 12. It is to be noted that the wire bonding of either of the semiconductor chips 7 and 8 may be performed firstly.

(5) Subsequently, the die pad 11, semiconductor chips 7 and 8, wires 50 and 50 and inner leads 12 and 12 are integrally embedded (molded) in an encapsulating resin 60. Finally, a tie bar (not shown) (for preventing the encapsulating resin from oozing into spaces between the outer leads 13 in the molding stage) formed in the lead frame 10 and the support leads 14 are cut and the outer leads 13 are bent according to a shape corresponding to the use.

In the semiconductor integrated circuit device fabricated as above, the semiconductor chip 7 is surely electrically insulated from the die pad 11 via the insulating film 1. Therefore, the semiconductor chip 7 and the semiconductor chip 8 can be surely electrically insulated from each other.

Figure 2:
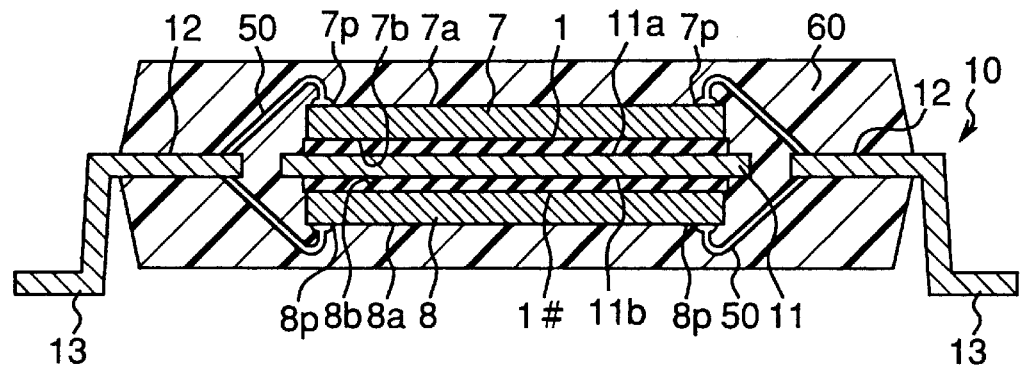
FIG. 2 is a view showing a modification example of the semiconductor integrated circuit device shown in FIGs. 1a and 1b.

As shown in FIG. 2, it is acceptable to mount a semiconductor chip 7 on one surface 11a of a die pad 11 via an insulating film 1 and mount a semiconductor chip 8 on the other surface 11b of the die pad 11 via an insulating film 1#. When fabricating this semiconductor integrated circuit device, there are executed the processes of bonding the insulating film 1 onto, for example, the one surface 11a of the die pad 11 by thermocompression bonding, bonding the semiconductor chip 7 onto the insulating film 1 by thermocompression bonding, bonding the insulating film 1# onto the other surface 11b of the die pad 11 by thermocompression bonding in the same procedure and thereafter bonding the semiconductor chip 8 onto the insulating film 1# by thermocompression bonding. Otherwise, it is acceptable to firstly bond the insulating films 1 and 1# onto both surfaces 11a and 11b of the die pad 11 by thermocompression bonding and thereafter bond the semiconductor chips 7 and 8 onto the insulating films 1 and 1# by thermocompression bonding. If this arrangement is adopted, not only the distance between the die pad 11 and the semiconductor chip 7 can be secured according to the thickness of the insulating film 1 but also the distance between the die pad 11 and the semiconductor chip 8 can be easily secured according to the thickness of the insulating film 1#.

(Second Embodiment)

Figure 3A:
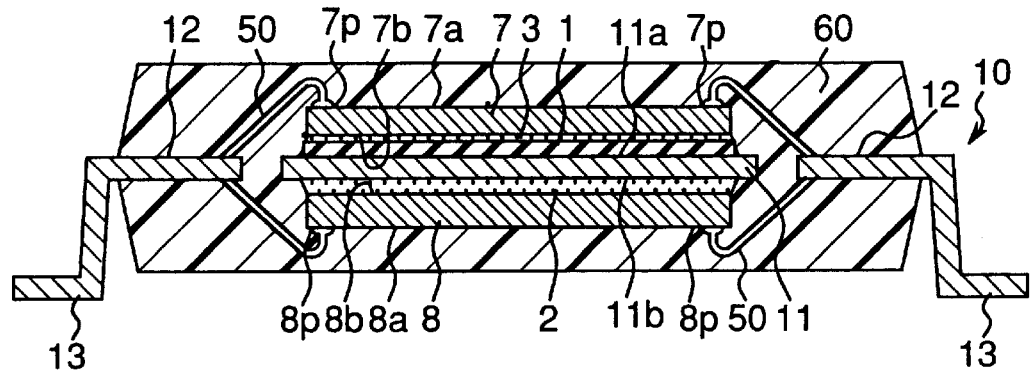
FIG. 3a is a longitudinal sectional view showing a semiconductor integrated circuit device according to a second embodiment of the present invention.
Figure 3B:
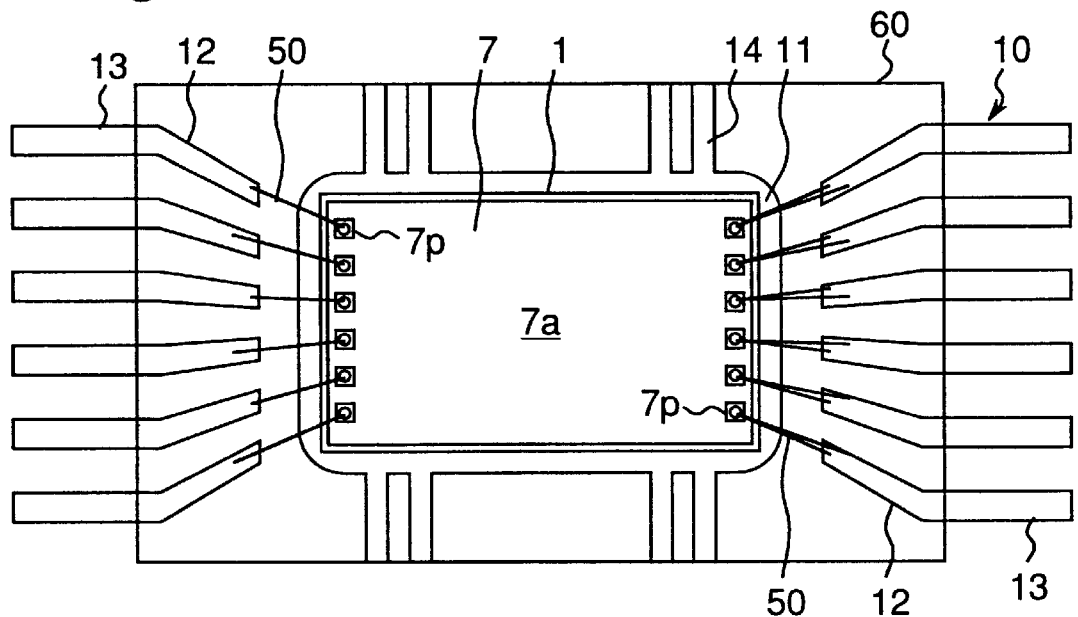
FIG. 3b is a view of the above semiconductor integrated circuit device viewed from above with its encapsulating resin in an upper portion removed.

FIG. 3a shows a longitudinal sectional view of a semiconductor integrated circuit device according to a second embodiment, while FIG. 3b schematically shows the semiconductor integrated circuit device viewed from above (with an upper portion of its encapsulating resin 60 removed). It is to be noted that the same components as those shown in FIG. 1 are denoted by the same reference numerals for the sake of easy understanding.

This semiconductor integrated circuit device differs from the one shown in FIG. 1 in that the insulating film 1 and the semiconductor chip 7 adjacent to it are bonded to each other by means of a silverless paste 3. The silverless pastes 2 and 3 are each adopted as a sort of adhesive to be hardened at a temperature at which the insulating film 1 maintains the solid state.

This semiconductor integrated circuit device is fabricated as follows.

(1) An insulating film 1 which has a dimension in the planar direction slightly greater than the semiconductor chip 7 and smaller than the die pad 11 is prepared by processing a tape-shaped silicon modified polyimide single-layer film by punching.

(2) The insulating film 1 is placed on one surface 11a of the die pad 11 formed in the lead frame 10 and it is pressed from above by a heated tool (having a pressing surface parallel to the surface 11a of the die pad 11). By this operation, the insulating film 1 is bonded to the surface 11a of the die pad 11 by thermocompression bonding. The conditions of thermocompression bonding differ depending on the glass-transition temperature of the tape. The heating temperature is set to a temperature of 300 to 400° C. (300° C. when the glass-transition temperature is 141° C.) higher than the glass-transition temperature of 140 to 250° C. of the insulating film 1, the time for pressing is set to about one second, and the application pressure is set to about 5 to 10 MPa. Then, the silverless paste 3 before being hardened is supplied onto the insulating film 1. The semiconductor chip 7 is placed on it and pressed from above by a collet (not shown). By this operation, the silverless paste 3 is interposed between the die pad 11 and the semiconductor chip 7 and spread in the planar direction. In this stage, even if the silverless paste 3 oozes from between the insulating film 1 and the semiconductor chip 7 and flows onto the die pad surface 11a, the electrical insulation between the die pad 11 and the semiconductor chip 7 is maintained because the silverless paste 3 is an insulating material. Subsequently, heating is performed in an oven (not shown) at a temperature of about 180° C. for one hour, thereby hardening the silverless paste 3. Thus, the semiconductor chip 7 is mounted on the die pad 11 via the insulating film 1 and the silverless paste 2 in a state in which they are electrically insulated from each other.

(3) Next, the silverless paste 2 before being hardened is supplied onto the other surface 11b with the other surface 11b of the die pad 11 facing upward. Thus, the semiconductor chip 8 is mounted on the die pad 11 via the silverless paste 2 according to the same procedure as described in connection with the first embodiment.

(4) Subsequently, wire bonding, molding and so forth are performed according to the same procedure as described in connection with the first embodiment.

According to the semiconductor integrated circuit device fabricated as above, the semiconductor chip 7 is surely electrically insulated from the die pad 11 via the insulating film 1 and the silverless paste 3. Therefore, the semiconductor chip 7 and the semiconductor chip 8 can be surely electrically insulated from each other.

Furthermore, by preparing the lead frame 10 in which the insulating film 1 has been bonded to the die pad 11 by thermocompression bonding or the like, the semiconductor chips 7 and 8 can be bonded to the die pad 11 by the equipment for the prior art semiconductor integrated circuit device in the stage of practically performing the die bonding of the semiconductor chips 7 and 8.

Figure 4:
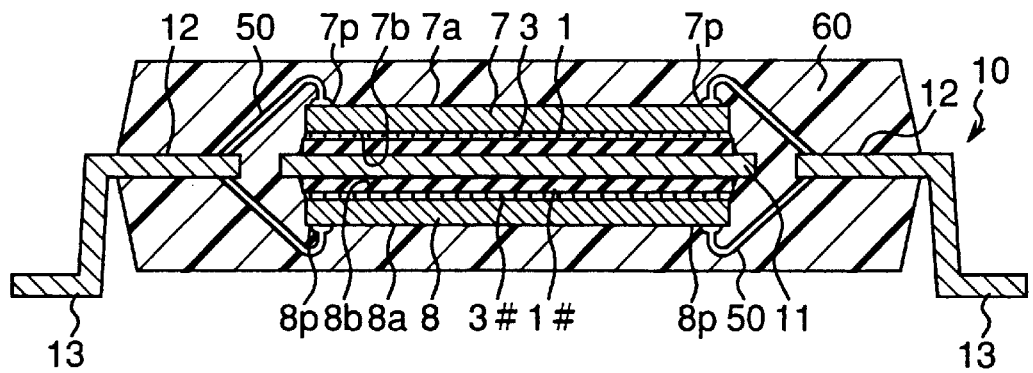
FIG. 4 is a view showing a modification example of the semiconductor integrated circuit device shown in FIGS. 3a and 3b.

As shown in FIG. 4, it is acceptable to mount a semiconductor chip 7 on the one surface 11a of a die pad 11 via an insulating film 1 and a silverless paste 3 and mount a semiconductor chip 8 on the other surface 11b of the die pad 11 via an insulating film 1# and a silverless paste 3#. When fabricating this semiconductor integrated circuit device, there are executed the processes of firstly bonding the insulating films 1 and 1# to, for example, both the surfaces 11a and 11b of the die pad 11 by thermocompression bonding, bonding the semiconductor chip 7 onto the insulating film 1 by means of the silverless paste 3 and bonding the semiconductor chip 8 onto the insulating film 1# by means of the silverless paste 3#. If this arrangement is adopted, not only the distance between the die pad 11 and the semiconductor chip 7 can be secured according to the thickness of the insulating film 1 but also the distance between the die pad 11 and the semiconductor chip 8 can be easily secured according to the thickness of the insulating film 1#.

(Third Embodiment)

Figure 5A:
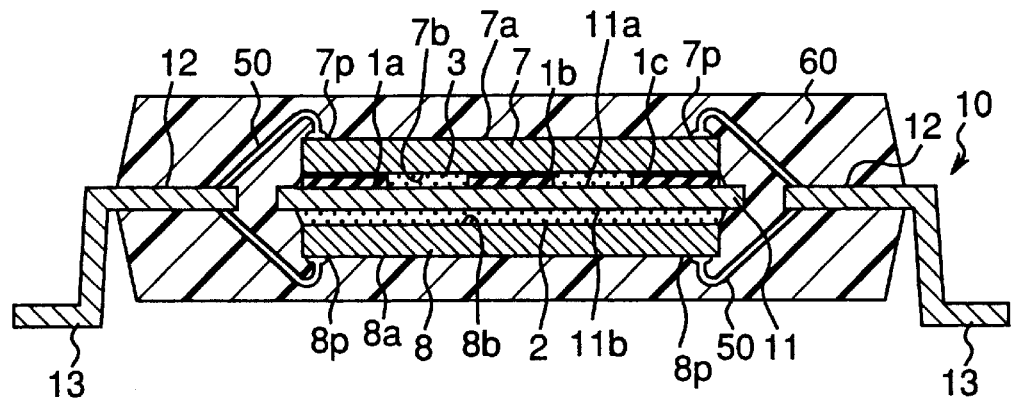
FIG. 5a is a longitudinal sectional view showing a semiconductor integrated circuit device according to a third embodiment of the present invention.
Figure 5B:
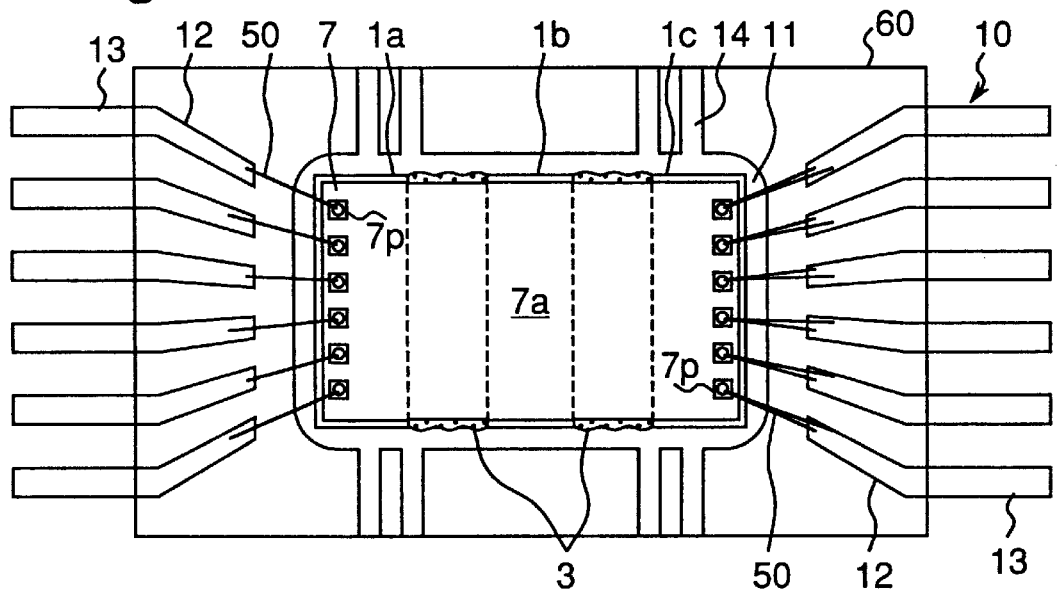
FIG. 5b is a view of the above semiconductor integrated circuit device viewed from above with its encapsulating resin in an upper portion removed.

FIG. 5a shows a longitudinal sectional view of a semiconductor integrated circuit device according to a third embodiment, while FIG. 5b schematically shows the semiconductor integrated circuit device viewed from above (with an upper portion of its encapsulating resin 60 removed). It is to be noted that the same components as those shown in FIGS. 1 and 3 are denoted by the same reference numerals for the sake of easy understanding.

This semiconductor integrated circuit device differs from the one shown in FIG. 3 in that the insulating film 1 is arranged as divided into three portions 1a, 1b and 1c along a surface of a die pad 11. Silverless pastes 2 and 3 are each adopted as a sort of adhesive to be hardened at a temperature at which the insulating films 1a, 1b and 1c maintain the solid state.

This semiconductor integrated circuit device is fabricated as follows.

(1) Strip-shaped insulating films 1a, 1b and 1c are prepared by processing a tape-shaped silicon modified polyimide single-layer film by punching. The dimensions in the lengthwise direction of the insulating films 1a, 1b and 1c are set slightly longer than the left- and right-hand sides of the semiconductor chip 7 in FIG. 5b and shorter than the left- and right-hand sides of the die pad 11.

(2) The insulating films 1a, 1b and 1c are placed on the one surface 11a of the die pad 11 formed in the lead frame 10. In this example, the positions where the insulating films 1a, 1b and 1c are placed are the position along the left-hand side, the center position and the position along the right-hand side, those located within the die pad surface 11a. The reason why the insulating films 1a and 1c are arranged along the left- and right-hand sides is for the purpose of securing the thickness of the adhesive layer just below the electrode pad 7p of the semiconductor chip 7 for the sake of convenience in the stage of wire bonding. Subsequently, the insulating films 1a, 1b and 1c are pressed from above by a heated tool (having a pressing surface parallel to the surface 11a of the die pad). By this operation, the insulating films 1a, 1b and 1c are bonded to the surface 11a of the die pad 11 by thermocompression bonding. The conditions of thermocompression bonding differ depending on the glass-transition temperature of the tape. The heating temperature is set to a temperature of 300 to 400° C. (300° C. when the glass-transition temperature is 141° C.) higher than the glass-transition temperature of 140 to 250° C. of the insulating films 1a, 1b and 1c, the time for pressing is set to about one second, and the application pressure is set to about 5 to 10 MPa. Then, the silverless paste 3 before being hardened is supplied onto the die pad surface 11a on which the insulating films 1a, 1b and 1c are provided. The semiconductor chip 7 is placed on them and pressed from above by a collet (not shown). By this operation, the silverless paste 3 is interposed between the die pad 11 and the semiconductor chip 7 and spread in the planar direction so that the space where the insulating films 1a, 1b and 1c are not existing on the die pad 11 is filled with the silverless paste. In this stage, even if the silverless paste 3 oozes from between the insulating films 1a, 1b and 1c and the semiconductor chip 7 and flows onto the die pad surface 11a, the electrical insulation between the die pad 11 and the semiconductor chip 7 is maintained because the silverless paste 3 is an insulating material. Subsequently, heating is performed in an oven (not shown) at a temperature of about 180° C. for one hour, thereby hardening the silverless paste 3. Thus, the semiconductor chip 7 is mounted on the die pad 11 via the insulating films 1a, 1b and 1c and the silverless paste 2 in a state in which they are electrically insulated from each other.

(3) Next, the silverless paste 2 before being hardened is supplied to the other surface 11b with the other surface 11b of the die pad 11 facing upward. Thus, the semiconductor chip 8 is mounted on the die pad 11 via the silverless paste 2 according to the same procedure as described in connection with the first embodiment.

(4) Subsequently, wire bonding, molding and so forth are performed according to the same procedure as described in connection with the first embodiment.

According to the semiconductor integrated circuit device fabricated as above, the semiconductor chip 7 is surely electrically insulated from the die pad 11 via the insulating films 1a, 1b and 1c and the silverless paste 3.

Therefore, the semiconductor chip 7 and the semiconductor chip 8 can be surely electrically insulated from each other.

Furthermore, since the insulating film is arranged as divided into a plurality of portions 1a, 1b and 1c along the surface 11a of the die pad 11, the warp of the die pad 11 due to the difference in thermal expansion coefficient between the die pad 11 and the insulating films 1a, 1b and 1c can be reduced.

Figure 6:
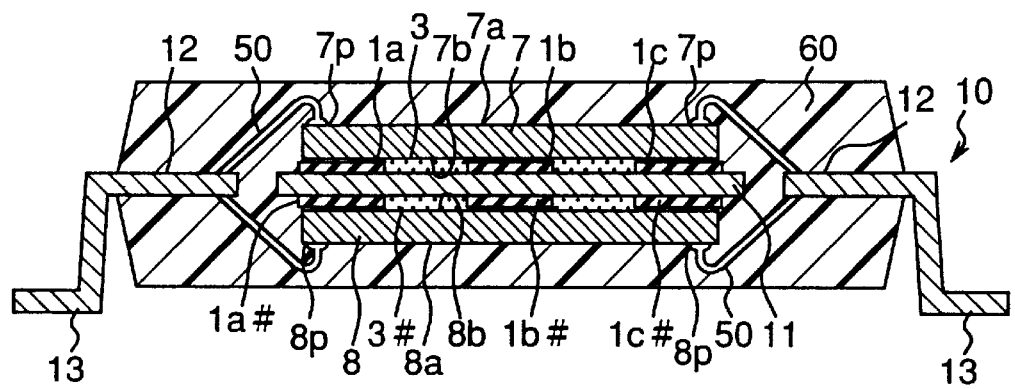
FIG. 6 is a view showing a modification example of the semiconductor integrated circuit device shown in FIGS. 5a and 5b.

As shown in FIG. 6, it is acceptable to mount the semiconductor chip 7 onto the one surface 11a of the die pad 11 via the insulating films 1a, 1b and 1c and the silverless paste 3 and mount the semiconductor chip 8 onto the other surface 11b of the die pad 11 via insulating films 1a#, 1b# and 1c# and a silverless paste 3#. When fabricating this semiconductor integrated circuit device, for example, there are executed the processes of bonding the insulating films 1a, 1b and 1c onto the one surface 11a of the die pad 11 by thermocompression bonding and bonding the insulating films 1a#, 1b# and 1c# onto the other surface 11b of the die pad 11 by thermocompression bonding. Subsequently, the semiconductor chip 7 is bonded onto the insulating films 1a, 1b and 1c by means of the silverless paste 3 and the semiconductor chip 8 is bonded onto the insulating films 1a#, 1b# and 1c# by means of the silverless paste 3#. If this arrangement is adopted, not only the distance between the die pad 11 and the semiconductor chip 7 can be secured according to the thickness of the insulating films 1a, 1b and 1c but also the distance between the die pad 11 and the semiconductor chip 8 can be easily secured according to the thicknesses of the insulating films 1a#, 1b# and 1c#.

Figure 9A:
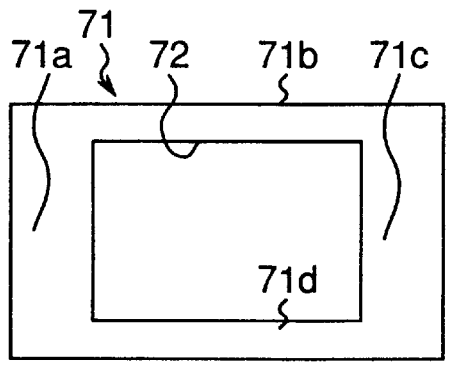
FIGS. 9a and 9b are views showing modification examples of an insulating film.
Figure 9B:
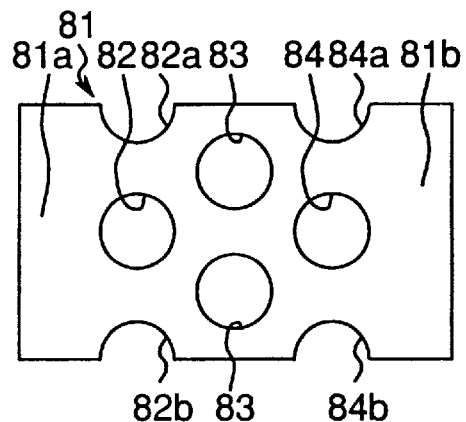
Figure 10:
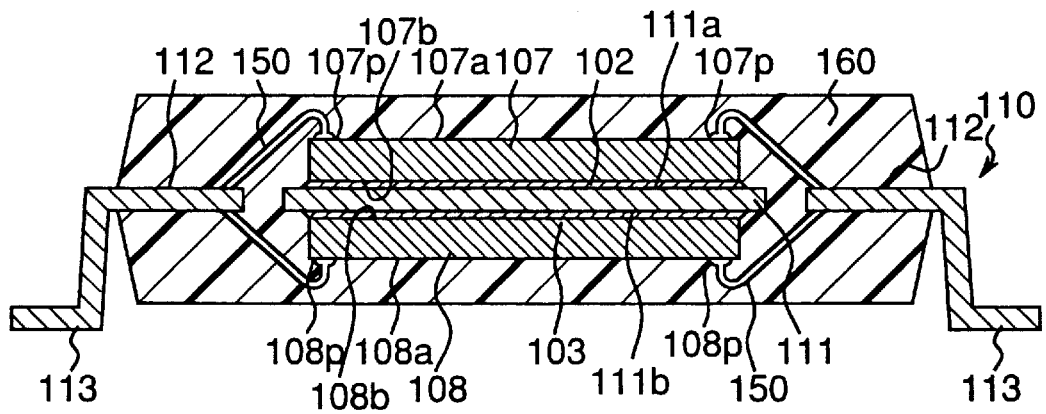
FIG. 10 is a longitudinal sectional view showing a prior art semiconductor integrated circuit device of which die pad and semiconductor chips are bonded to each other by means of a silver paste.
Figure 11:
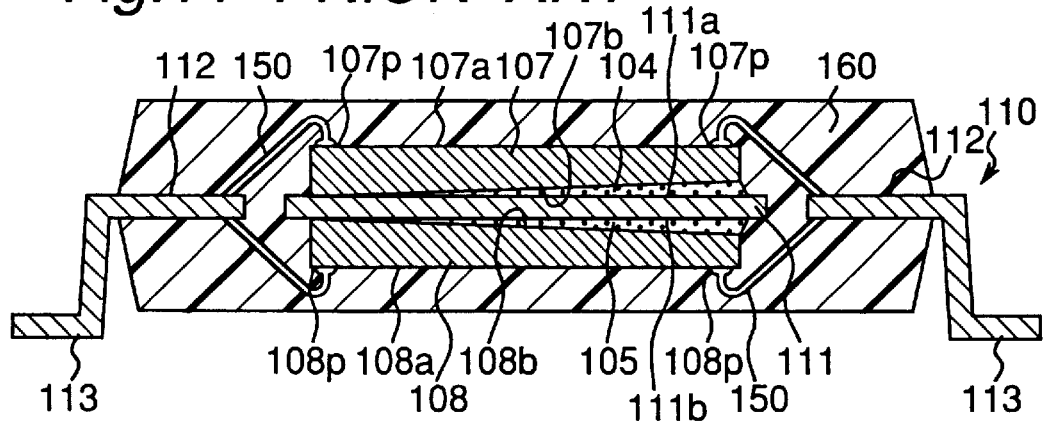
FIG. 11 is a view for explaining a disadvantage of the prior art semiconductor integrated circuit device of which die pad and semiconductor chips are bonded to each other by means of a silverless paste.

Furthermore, it is acceptable to adopt insulating films 71 and 81 provided with a hole penetrating the film surface as shown in FIGS. 9a and 9b in place of the insulating film 1 shown in FIG. 3a. The insulating film 71 shown in FIG. 9a has a rectangular hole 72 at the center and includes a left-hand side portion 71a and a right-hand side portion 71c to be arranged just below the electrode pads 7p of the semiconductor chip 7 and elongated connecting portions 71b and 71d for connecting them. On the other hand, the insulating film 81 shown in FIG. 9b has a plurality of holes 82, 83 and 84 and cutaway portions 82a, 82b, 84a and 84b and includes a left-hand side portion 81a and a right-hand side portion 81b to be arranged just below the electrode pad 7p of the semiconductor chip 7 and net-shaped portions for connecting them. If this arrangement is adopted, the insulating films 71 and 81 is allowed to have a reduced portion (area) to be put in contact with the die pad 11 by virtue of the existence of the holes. Therefore, the warp of the die pad 11 due to the difference in thermal expansion coefficient between the die pad 11 and the insulating films 71 and 81 can be reduced.

(Fourth Embodiment)

Figure 7A:
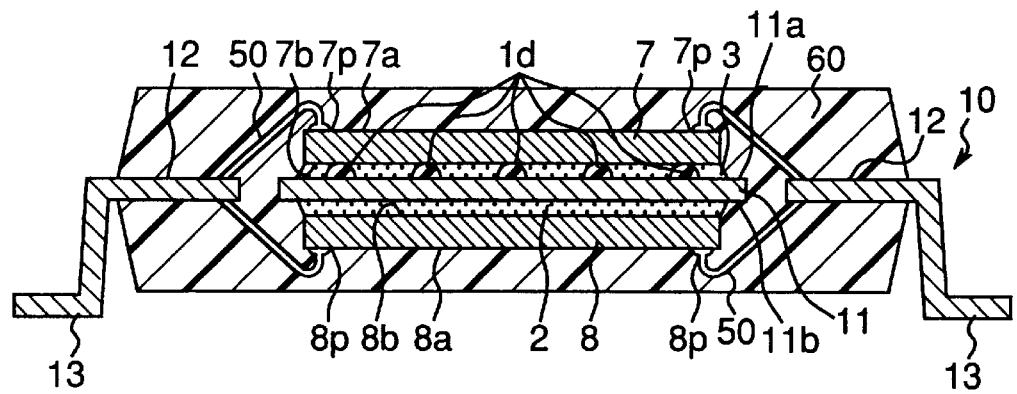
FIG. 7a is a longitudinal sectional view showing a semiconductor integrated circuit device according to a fourth embodiment of the present invention.
Figure 7B:
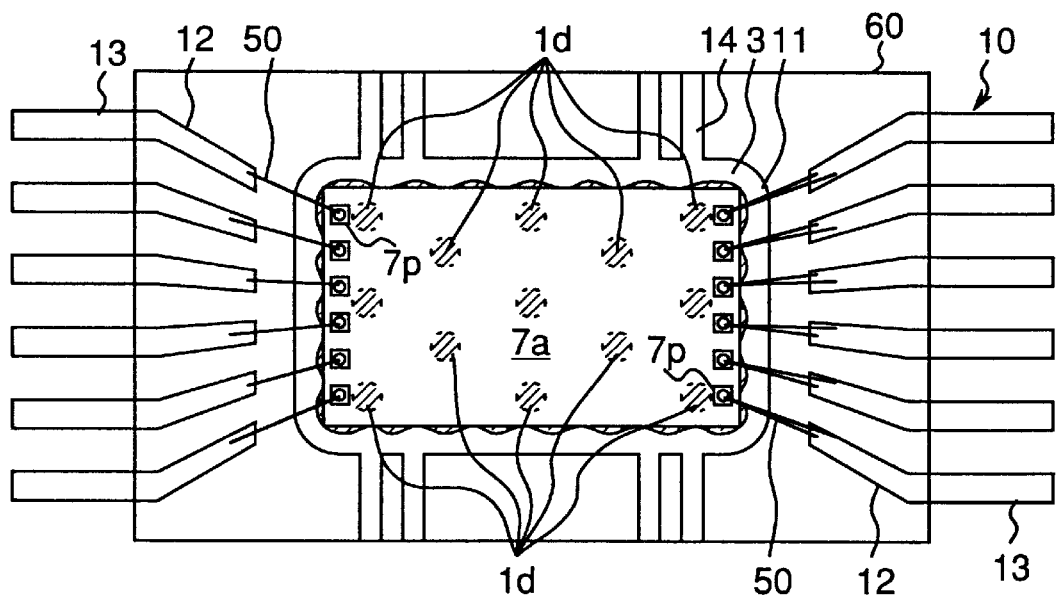
FIG. 7b is a view of the above semiconductor integrated circuit device viewed from above with its encapsulating resin in an upper portion removed.

FIG. 7a shows a longitudinal sectional view of a semiconductor integrated circuit device according to a fourth embodiment, while FIG. 7b schematically shows the semiconductor integrated circuit device viewed from above (with an upper portion of its encapsulating resin 60 removed). It is to be noted that the same components as those shown in FIGS. 1, 3 and 5 are denoted by the same reference numerals for the sake of easy understanding.

This semiconductor integrated circuit device differs from the one shown in FIGS. 3a and 3b in that a plurality of semispherical spacers 1d, 1d, . . . are provided as separated apart from one another on one surface 11a of a die pad 11 in place of the insulating film 1. As a material of the semispherical spacers 1d, a thermoplastic silicon modified polyimide of which glass-transition temperature falls within a range of 140 to 250° C. being, for example, 141° C. similar to the material of the insulating film 1 is adopted. This material maintains the solid state in the bonding process of the die pad 11 and semiconductor chips 7 and 8 by means of silverless pastes 2 and 3.

This semiconductor integrated circuit device is fabricated as follows.

(1) To a plurality of portions of the one surface 11a of the die pad 11 is supplied an equal amount of silicon modified polyimide before being hardened. This supply is performed by pressurizing by means of a dispenser the silicon modified polyimide stuffed, for example, in a syringe (not shown) from the tail end side of the syringe through a multi-nozzle (a plurality of branched nozzles) attached to the tip end of the syringe. Subsequently, by performing curing (heating), the silicon modified polyimide supplied to the plurality of portions is formed into semispherical shapes by the surface tension and then hardened.

(2) Next, the silverless paste 3 which serves as a first adhesive before being hardened is provided onto the die pad surface 11a on which the semispherical spacers 1d are provided. The semiconductor chip 7 is placed on them and is pressed from above by a collet (not shown). By this operation, the silverless paste 3 is interposed between the die pad 11 and the semiconductor chip 7 and spread in the planar direction so that the space where the semispherical spacers 1d are not existing on the die pad 11 is filled with the silverless paste. In this case, the semiconductor chip 7 comes closer to the die pad 11, whereas the semiconductor chip 7 abuts against the upper ends of the semispherical spacers 1d and stops at a specified distance from the die pad surface 11a. Furthermore, even if the silverless paste 3 oozes from between the semispherical spacers 1d and the semiconductor chip 7 and flows onto the die pad surface 11a, the electrical insulation between the die pad 11 and the semiconductor chip 7 is maintained because the silverless paste 3 is an insulating material. Subsequently, heating is performed in an oven (not shown) at a temperature of about 180° C. for one hour, thereby hardening the silverless paste 3. Thus, the semiconductor chip 7 is mounted on the die pad 11 via the semispherical spacers 1d and the silverless paste 2 in a state in which they are electrically insulated from each other.

(3) Next, a silverless paste 2 which serves as a second adhesive before being hardened is supplied to the other surface 11b with the other surface 11b of the die pad 11 facing upward. Then, the semiconductor chip 8 is mounted on the die pad 11 via the silverless paste 2 according to the same procedure as described in connection with the first embodiment.

(4) Subsequently, wire bonding, molding and so forth are performed according to the same procedure as described in connection with the first embodiment.

According to the semiconductor integrated circuit device fabricated as above, the semiconductor chip 7 is surely electrically insulated from the die pad 11 via the semispherical spacers 1d. Therefore, the semiconductor chip 7 and the semiconductor chip 8 can be surely electrically insulated from each other.

Furthermore, by preparatorily completing the process for providing the plurality of semispherical spacers on the die pad 11 as described above, the semiconductor chips 7 and 8 can be bonded to the die pad 11 by the equipment for the prior art semiconductor integrated circuit device in the stage of practically performing the die bonding of the semiconductor chips 7 and 8.

Furthermore, since the plurality of semispherical spacers are provided as separated apart from one another, neither the warp of the die pad 11 nor the like occurs differently from the case where the insulating film 1 is bonded to the die pad 11.

In each of the aforementioned embodiments, the semiconductor chips 7 and 8 can be correctly operated even in the case where a semiconductor chip having a P-type silicon substrate and a semiconductor chip having an N-type silicon substrate are used as the semiconductor chip 7 and the semiconductor chip 8 or in the case where the silicon substrates are of the same type and the silicon substrates have mutually different electric potentials in operation. That is, according to this semiconductor integrated circuit device, semiconductor chips having different functions can be integrally encapsulated and correctly operated. For example, when the semiconductor chip 7 is a decoder, the semiconductor chip 8 can be a DRAM (Dynamic Random Access Memory) or an SRAM (Static Random Access Memory). Furthermore, when the semiconductor chip 7 is a flash memory, the semiconductor chip 8 can be an SRAM. Therefore, this arrangement allows the semiconductor integrated circuit devices used in electronic equipment to be reduced in number and allows the electronic equipment to have improved functions without causing an increase in volume of the electronic equipment.

Figure 8:
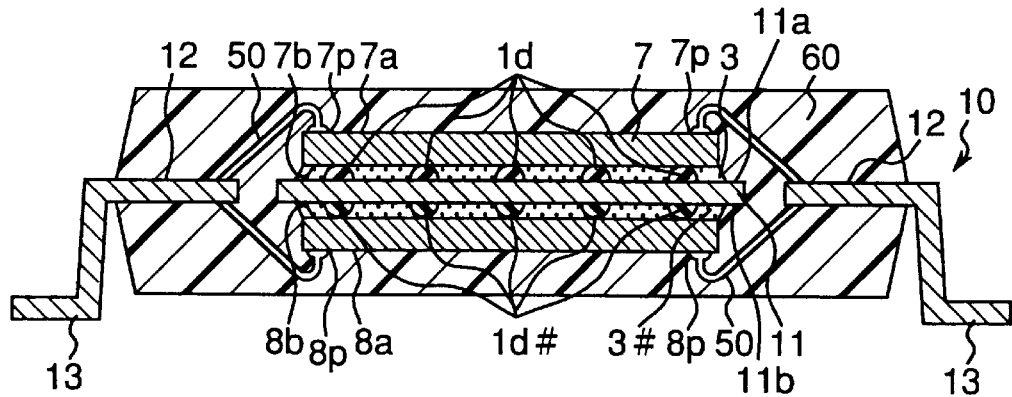
FIG. 8 is a view showing a modification example of the semiconductor integrated circuit device shown in FIGS. 7a and 7b.

As shown in FIG. 8, it is acceptable to mount the semiconductor chip 7 on the one surface 11a of the die pad 11 via the semispherical spacers 1d and the silverless paste 3 and mount the semiconductor chip 8 on the other surface 11b of the die pad 11 via semispherical spacers 1d# and a silverless paste 3#. When fabricating this semiconductor integrated circuit device, there is adopted the arrangement of providing the semispherical spacers 1d on the one surface 11a of the die pad 11 and providing semispherical spacers 1d# on the other surface 11b of the die pad 11, for example. Subsequently, the semiconductor chip 7 is bonded by means of the silverless paste 3 onto the surface 11a on which the semispherical spacers 1d have been provided, and the semiconductor chip 8 is bonded by means of the silverless paste 3# onto the surface 11b on which the semispherical spacers 1d# have been provided. If this arrangement is adopted, not only the distance between the die pad 11 and the semiconductor chip 7 can be secured according to the thickness of the semispherical spacers 1d but also the distance between the die pad 11 and the semiconductor chip 8 can be easily secured according to the thickness of the semispherical spacers 1d#.

In addition, the insulating film may be comprised of a resin material having an amido bond or both the amido bond and imido bond instead of the imido bond.

As apparent from the above description, the semiconductor integrated circuit device of the present invention has integrally the flat-plate-shaped die pad formed in the lead frame, the first semiconductor chip bonded via the first adhesive layer to one surface of the die pad and the second semiconductor chip bonded via the second adhesive layer to the other surface of the die pad, wherein at least one of the first adhesive layer and the second adhesive layer is comprised of the insulating film having the specified thickness. With this arrangement, at least one of the first semiconductor chip and the second semiconductor chip can be surely electrically insulated from the die pad via the insulating film. Therefore, the first semiconductor chip and the second semiconductor chip can be surely electrically insulated from each other.

As a result, the semiconductor chips can be correctly operated even in the case where a semiconductor chip having a P-type silicon substrate and a semiconductor chip having an N-type silicon substrate are used as the first semiconductor chip and the second semiconductor chip or in the case where the silicon substrates are of the same type and the silicon substrates have mutually different electric potentials in operation. That is, according to this semiconductor integrated circuit device, semiconductor chips having different functions can be integrally encapsulated and correctly operated. Therefore, this arrangement allows the semiconductor integrated circuit devices used in electronic equipment to be reduced in number and allows the electronic equipment to have improved functions without causing an increase in volume of the electronic equipment.

According to the semiconductor integrated circuit device of one embodiment, the insulating film is comprised of a resin material having the imide bond or the amide bond or both the imide bond and amide bond. With this arrangement, by performing heating and pressing with the above insulating film interposed between the die pad and the first semiconductor chip in the die bonding stage, the die pad and the first semiconductor chip can be easily bonded (by thermocompression bonding) to each other. Similarly, by performing heating and pressing with the above insulating film interposed between the die pad and the second semiconductor chip in the die bonding stage, the die pad and the second semiconductor chip can be easily bonded to each other.

According to the semiconductor integrated circuit device of one embodiment, the dimension in the planar direction of the insulating film is greater than the dimension in the planar direction of the semiconductor chip bonded to the insulating film. With this arrangement, when the first adhesive layer is the above insulating film, the die pad and the first semiconductor chip can be more surely insulated electrically from each other. Similarly, when the second adhesive layer is the above insulating film, the die pad and the second semiconductor chip can be more surely insulated electrically from each other.

According to the semiconductor integrated circuit device of one embodiment, the insulating film and the semiconductor chip adjacent to the insulating film are bonded to each other by means of the adhesive which is hardened at a temperature at which the insulating film maintains the solid state. With this arrangement, the first semiconductor chip and the second semiconductor chip can be surely electrically insulated from each other. In addition to this, by preparing the lead frame in which the insulating film has been bonded to the die pad by thermocompression bonding, each semiconductor chip can be bonded to the die pad by the equipment for the prior art semiconductor integrated circuit device in the stage of practically performing the die bonding of each semiconductor chip.

According to the semiconductor integrated circuit device of one embodiment, the adhesive is the insulating material. With this arrangement, even if the adhesive oozes from between the insulating film and the semiconductor chip and flows onto the die pad surface when the adhesive is interposed between the insulating film and the semiconductor chip and spread in the planar direction in the die bonding stage, the electrical insulation between the die pad and the semiconductor chip is maintained.

According to the semiconductor integrated circuit device of one embodiment, the insulating film is provided with at least one hole penetrating its film surface. With this arrangement, the portion (area) which belongs to the insulating film and comes in contact with the die pad is reduced. Therefore, the warp of the die pad due to the difference in thermal expansion coefficient between the die pad and the insulating film can be reduced.

According to the semiconductor integrated circuit device of one embodiment, the insulating film is divided into a plurality of portions along the die pad surface. With this arrangement, the warp of the die pad due to the difference in thermal expansion coefficient between the die pad and the insulating film can be reduced.

The semiconductor integrated circuit device of the present invention has integrally the flat-plate-shaped die pad formed in the lead frame, the first semiconductor chip bonded by means of the first adhesive to one surface of the die pad and the second semiconductor chip bonded by means of the second adhesive to the other surface of the die pad, wherein the plurality of semispherical spacers made of the material which maintains the solid state through the bonding process of the die pad and the semiconductor chips by the adhesive are provided on the one surface or the other surface or both the surfaces of the die pad so that they are separated apart from one another. With this arrangement, at least one of the first semiconductor chip and the second semiconductor chip can be surely electrically insulated from the die pad via the semispherical spacers. Therefore, the first semiconductor chip and the second semiconductor chip can be surely electrically insulated from each other.

Furthermore, by preparing the lead frame in which the die pad is provided with the plurality of semispherical spacers, each semiconductor chip can be bonded to the die pad by the equipment for the prior art semiconductor integrated circuit device in the stage of practically performing the die bonding of each semiconductor chip.

Furthermore, the plurality of semispherical spacers are separated apart from one another, and therefore, neither the warp of the die pad nor the like occurs differently from the case where the insulating film is bonded to the die pad.

According to the semiconductor integrated circuit device fabricating method of the present invention, in the process for spreading the first adhesive in the planar direction while interposing the adhesive between the insulating film and the first semiconductor chip, the distance between the die pad and the first semiconductor chip can be secured by virtue of the existence of the insulating film which maintains the solid state. This distance is maintained even in the bonding process of the die pad and the second semiconductor chip. Therefore, the first semiconductor chip can be surely electrically insulated from the die pad via the insulating film. Therefore, the first semiconductor chip and the second semiconductor chip can be surely electrically insulated from each other.

Furthermore, by preparatorily completing the process for bonding the insulating film to the one surface of the die pad, each semiconductor chip can be bonded to the die pad by the equipment for the prior art semiconductor integrated circuit device in the stage of practically performing the die bonding of each semiconductor chip.

According to the semiconductor integrated circuit device fabricating method of the present invention, in the process for spreading the first adhesive in the planar direction while interposing the first adhesive between the one surface of the die pad and the first semiconductor chip, the distance between the die pad and the first semiconductor chip can be secured by virtue of the existence of the plurality of semispherical spacers which maintain the solid state. This distance is maintained even in the bonding process of the die pad and the second semiconductor chip. Therefore, the first semiconductor chip can be surely electrically insulated from the die pad via the semispherical spacers. Therefore, the first semiconductor chip and the second semiconductor chip can be surely electrically insulated from each other.

Furthermore, by preparatorily completing the process for providing the plurality of semispherical spacers on the one surface of the die pad, each semiconductor chip can be bonded to the die pad by the equipment for the prior art semiconductor integrated circuit device in the stage of practically performing the die bonding of each semiconductor chip.

Furthermore, the plurality of semispherical spacers are separated apart from one another, and therefore, neither the warp of the die pad nor the like occurs differently from the case where the insulating film is bonded to the die pad.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor integrated circuit device comprising:
    a flat-plate-shaped die pad formed in a lead frame;
    a first semiconductor chip bonded via a first adhesive layer to a first surface of the die pad, and a second semiconductor chip bonded via a second adhesive layer to a second surface of the die pad, and
    at least one of the first adhesive layer and the second adhesive layer arranged as adhesive strips between which are at least one strip of a solid insulating film having a specified uniform and constant thickness, wherein the strips of adhesive layer and insulating film together form a single layer separating the die pad from at least one of the semiconductor chips.

2. A semiconductor integrated circuit device as claimed in claim 1, wherein
    the insulating film is comprised of a resin material having an imide bond or an amide bond or both the imide bond and amide bond.

3. A semiconductor integrated circuit device as claimed in claim 2, wherein
    a dimension in a planar direction of the insulating film is greater than a dimension in a planar direction of the semiconductor chip bonded to the insulating film.

4. A semiconductor integrated circuit device as claimed in claim 1, wherein the at least one of the first adhesive layer and the second adhesive layer includes a thermally-activated adhesive.

5. A semiconductor integrated circuit device as claimed in claim 4, wherein
    the adhesive is an insulating material.

6. A semiconductor integrated circuit device as claimed in claim 1, wherein
    the insulating film is provided with at least one hole penetrating its film surface.

7. A semiconductor integrated circuit device as claimed in claim 1, wherein
    the insulating film is arranged as divided into a plurality of portions along a die pad surface.

8. A semiconductor integrated circuit device comprising:
    a flat-plate-shaped die pad formed in a lead frame;
    a first semiconductor chip bonded by means of a first insulating adhesive to a first surface of the die pad and a second semiconductor chip bonded by means of a second insulative adhesive to a second surface of the die pad and the second surface is opposite to the first surface, and
    a plurality of insulative semispherical spacers formed of silicon modified polyimide which maintains a solid state through a bonding process of the die pad and the semiconductor chips by the adhesives, deposited on the first surface or second surface or both of the surfaces of the die pad such that the die pad is separated apart from the semiconductor chips by the spacers.

9. A method for bonding semiconductor chips to a die pad to form a semiconductor integrated device having a flat-plate-shaped die pad formed in a lead frame, a first semiconductor chip and a second semiconductor chip,
    wherein the method comprises the steps of:
    a. bonding the first semiconductor chip to a first surface of the die pad by forming a single layer between the chip and die pad, where the single layer includes interleaving regions of adhesive and insulating solid material;
    b. during step (a) maintaining a uniform and constant gap between the first surface of the die pad and the first semiconductor chip, where the gap is defined by a thickness of the insulating material;
    c. during steps (a) and (b), maintaining the insulating material in a solid state, and
    d. bonding the second semiconductor chip to a second surface of the die pad.

* * * * *